(12) United States Patent
Kim et al.

(10) Patent No.: US 12,219,835 B2
(45) Date of Patent: *Feb. 4, 2025

(54) DISPLAY DEVICE

(71) Applicant: Samsung Display Co., LTD., Yongin-si (KR)

(72) Inventors: Sun Ho Kim, Seongnam-si (KR); Gun Hee Kim, Seoul (KR); Dong Hwan Shim, Hwaseong-si (KR); Tae Hoon Yang, Yongin-si (KR); Sun Hee Lee, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/387,145

(22) Filed: Nov. 6, 2023

(65) Prior Publication Data
US 2024/0074261 A1    Feb. 29, 2024

Related U.S. Application Data

(63) Continuation of application No. 18/106,438, filed on Feb. 6, 2023, now Pat. No. 11,825,714, which is a
(Continued)

(30) Foreign Application Priority Data

Mar. 4, 2020   (KR) ........................ 10-2020-0027041

(51) Int. Cl.
*H10K 59/131*   (2023.01)
*H10K 59/121*   (2023.01)

(52) U.S. Cl.
CPC ......... *H10K 59/131* (2023.02); *H10K 59/121* (2023.02)

(58) Field of Classification Search
CPC . H01L 27/3276; H10K 59/121; H10K 59/131
See application file for complete search history.

(56) References Cited

U.S. PATENT DOCUMENTS 9,490,312 B2   11/2016   Lee et al.
11,289,567 B2   3/2022   Lee et al.
(Continued)

FOREIGN PATENT DOCUMENTS

| KR | 1020170113066 A | 10/2017 |
| KR | 1020180125061 A | 11/2018 |
| KR | 1020210016152   | 2/2021  |

*Primary Examiner* — Douglas M Menz
(74) *Attorney, Agent, or Firm* — CANTOR COLBURN LLP

(57) ABSTRACT

A display device includes a display area which includes a first display area including a plurality of first pixels and a second display area including at least one second pixel and at least one light-transmitting portion, a peripheral area disposed around the display area, a data line including a first portion and a second portion spaced apart from each other in a predetermined direction with the light-transmitting portion therebetween, and a conductive pattern disposed at a different conductive layer from the data line. The conductive pattern includes a first pattern portion including a bypass portion that bypasses a periphery of the second display area in a plan view and disposed in the first display area, and the first pattern portion includes a first end electrically connected to the first portion of the data line and a second end electrically connected to the second portion of the data line.

13 Claims, 15 Drawing Sheets

Related U.S. Application Data continuation of application No. 17/138,771, filed on Dec. 30, 2020, now Pat. No. 11,574,986.

(56) References Cited

U.S. PATENT DOCUMENTS

| | | |
|---|---|---|
| 11,360,518 B2 | 6/2022 | Shin et al. |
| 11,825,714 B2 * | 11/2023 | Kim .................. H10K 59/131 |
| 2016/0172427 A1 | 6/2016 | Lee et al. |
| 2018/0068919 A1 | 3/2018 | Chung et al. |
| 2018/0151663 A1 | 5/2018 | Kim et al. |
| 2020/0027943 A1 * | 1/2020 | Kim .................. H10K 59/131 |
| 2021/0104593 A1 | 4/2021 | Kang et al. |
| 2021/0296550 A1 | 9/2021 | Li et al. |

* cited by examiner

DISPLAY DEVICE

This application is a continuation of U.S. patent application Ser. No. 18/106,438, filed on Feb. 6, 2023, which is a continuation of U.S. patent application Ser. No. 17/138,771, filed on Dec. 30, 2020, which claims priority to Korean Patent Application No. 10-2020-0027041, filed on Mar. 4, 2020, and all the benefits accruing therefrom under 35 U.S.C. § 119, the content of which in its entirety is herein incorporated by reference.

BACKGROUND

(a) Technical Field

The present disclosure relates to a display device.

(b) Description of the Related Art

A display device such as a liquid crystal display ("LCD"), an organic light emitting diode ("OLED") display, etc. includes a display panel including a plurality of pixels that can display an image. Each pixel may include a pixel electrode for receiving a data signal, and the pixel electrode may be connected to at least one transistor to receive the data signal.

Various display devices having various functions in addition to image display have been developed.

SUMMARY

The present disclosure has been made in an effort to provide a display device having a light-transmitting portion through which light of an optical member may be transmitted, and that may secure a sufficient area of the light-transmitting portion and reduce a parasitic capacitance and coupling between signal lines.

An embodiment provides a display device including a display area which includes a first display area including a plurality of first pixels and a second display area including at least one second pixel and at least one light-transmitting portion, a peripheral area disposed around the display area, a data line which includes a first portion and a second portion spaced apart from each other in a predetermined direction with the light-transmitting portion therebetween, and a conductive pattern disposed at a different conductive layer from the data line, where the conductive pattern includes a first pattern portion including a bypass portion that bypasses a periphery of the second display area in a plan view and disposed in the first display area, and the first pattern portion includes a first end that is electrically connected to the first portion of the data line and a second end that is electrically connected to the second portion of the data line.

In an exemplary embodiment, the display device may further include a plurality of first voltage lines which transmits a first voltage, where the first pattern portion may include a first vertical portion that overlaps the first voltage line in the plan view and extends along the first voltage line.

In an exemplary embodiment, the conductive pattern may further include a second pattern portion that is disposed in the first display area and spaced apart from the first pattern portion.

In an exemplary embodiment, the second pattern portion may include a second vertical portion that overlaps the first voltage line in the plan view and extends along the first voltage line.

In an exemplary embodiment, the first pattern portion may further include a first horizontal portion that extends from the first vertical portion in a different direction from the first vertical portion, and the second pattern portion may further includes a second horizontal portion that extends from the second vertical portion in a different direction from the second vertical portion.

In an exemplary embodiment, the display device may further include a plurality of second voltage lines which crosses the first voltage line and transmits a second voltage, where the first horizontal portion and the second horizontal portion may overlap the second voltage line in the plan view and may extend along the second voltage line.

In an exemplary embodiment, the second pattern portion may have a mesh shape.

In an exemplary embodiment, the second pattern portion may receive a constant voltage.

In an exemplary embodiment, the peripheral area may include a first peripheral area and a second peripheral area facing each other with the display area therebetween, the first end of the first pattern portion may be electrically connected to the first portion of the data line in the first peripheral area, and the second end of the first pattern portion may be electrically connected to the second portion of the data line in the second peripheral area.

In an exemplary embodiment, the peripheral area may include a first peripheral area and a second peripheral area facing each other with the display area therebetween, the first end of the first pattern portion may be electrically connected to the first portion of the data line in the first display area disposed between the first peripheral area and the second display area, and the second end of the first pattern portion may be electrically connected to the second portion of the data line in the first display area disposed between the second peripheral area and the second display area.

In an exemplary embodiment, a length of the first pattern portion in the predetermined direction may be shorter than a length of the display area in the predetermined direction.

Another embodiment provides a display device including a display area which includes a first display area including a plurality of first pixels and a second display area which includes at least one second pixel and at least one light-transmitting portion, a data line which includes a first portion and a second portion spaced apart from each other in a predetermined direction with the light-transmitting portion therebetween, and a conductive pattern disposed at a different conductive layer from the data line and disposed in the first display area, where the conductive pattern includes a first pattern portion and a second pattern portion that are spaced apart from each other with a separation portions therebetween, the first pattern portion includes a bypass portion disposed between the second pattern portion and the second display area, and the first pattern portion is electrically connected to the first portion and the second portion of the data line.

of the display area. the display device may further include a plurality of first voltage lines which transmits a first voltage, and at least one of the first pattern portion and the second pattern portion may include a vertical portion that overlaps the first voltage line in a plan view and extends along the first voltage line.

In an exemplary embodiment, the at least one of the first pattern portion and the second pattern portion may further include a horizontal portion that extends from the vertical portion in a different direction from the vertical portion.

In an exemplary embodiment, the display device may further include a plurality of second voltage lines which crosses the first voltage line and transmits a second voltage, and the horizontal portion may overlap the second voltage line in the plan view and extends along the second voltage line.

In an exemplary embodiment, the second pattern portion may receive a constant voltage.

In an exemplary embodiment, the display device may further include a first peripheral area and a second peripheral area facing each other with the display area therebetween, and the first pattern portion may be electrically connected to the first portion of the data line in the first peripheral area and may be electrically connected to the second portion of the data line in the second peripheral area.

In an exemplary embodiment, the first pattern portion may be electrically connected to the first portion of the data line in the first display area around a first side of the second display area, and may be electrically connected to the second portion of the data line in the first display area around a second side opposite to the first side of the second display area.

Another embodiment provides a display device including a display area which includes a first display area including a plurality of first pixels and a second display area which includes at least one second pixel and at least one light-transmitting portion, a data line which includes a first portion and a second portion spaced apart from each other in a predetermined direction with the light-transmitting portion therebetween, a plurality of first voltage lines which transmits a first voltage, and a conductive pattern disposed at a different conductive layer from the data line and the first voltage line and disposed in the first display area, where the conductive pattern may be electrically connected to the first portion and the second portion of the data line, and the conductive pattern may include a portion overlapping the first voltage line in a plan view and extending along the first voltage line.

In an exemplary embodiment, the display device may further include a plurality of second voltage lines which crosses the first voltage line and transmits a second voltage, and the conductive pattern may further include a portion that overlaps the second voltage line in the plan view and extends along the second voltage line.

According to embodiments of the present invention, in a display device having a light-transmitting portion through which light of an optical member may be transmitted, it is possible to secure a sufficient area of the light-transmitting portion and reduce a parasitic capacitance and coupling between signal lines.

DETAILED DESCRIPTION

Figure 1:
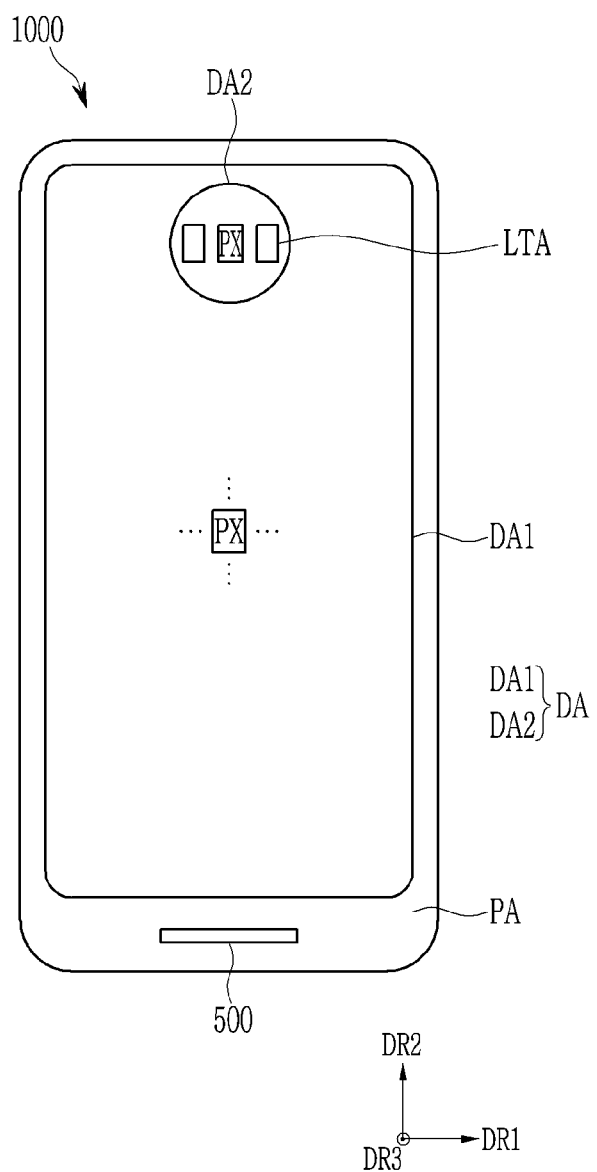
FIG. 1 illustrates a plan view of a display device according to an embodiment of the present invention.

The present invention will be described more fully hereinafter with reference to the accompanying drawings, in which embodiments of the invention are shown. As those skilled in the art would realize, the described embodiments may be modified in various different ways, all without departing from the spirit or scope of the present disclosure.

Parts that are irrelevant to the description will be omitted to clearly describe the present disclosure, and like reference numerals designate like elements throughout the specification.

Further, in the drawings, the size and thickness of each element are arbitrarily illustrated for ease of description, and the present disclosure is not necessarily limited to those illustrated in the drawings. In the drawings, the thicknesses of layers, films, panels, areas, regions, etc., are exaggerated for clarity. In the drawings, for ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means disposed on or below the object portion, and does not necessarily mean disposed on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Throughout this specification, a plan view means a view when observing a surface parallel to two directions (e.g., a first direction DR1 and a second direction DR2) crossing each other, and a cross-sectional view means a view when observing a surface cut in a direction (e.g., a third direction) perpendicular to the surface parallel to the first direction DR1 and the second direction DR2. Also, to overlap two constituent elements means that the two constituent elements are overlapped in the third direction (e.g., a direction perpendicular to an upper surface of the substrate) unless stated otherwise.

First, a structure of a display device according to an embodiment of the present invention will be described with reference to FIG. 1 to FIG. 4.

Figure 2:
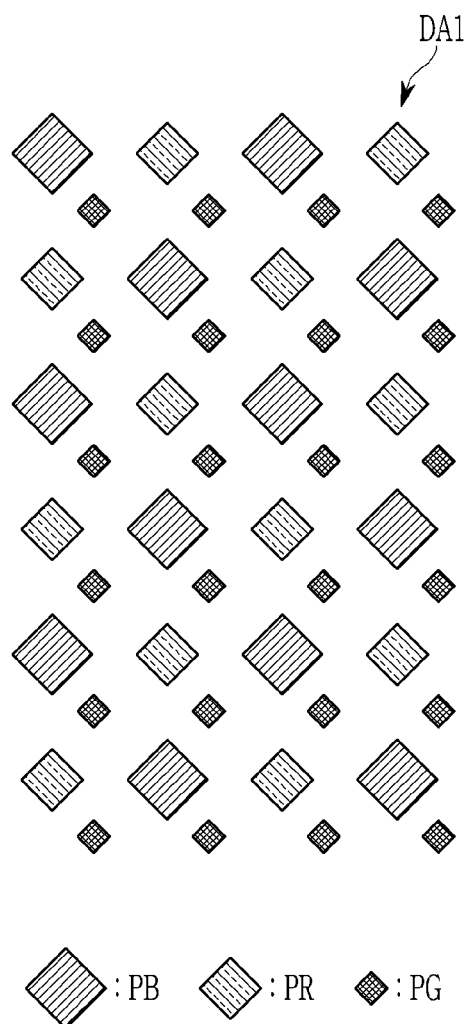
FIG. 2 and FIG. 3 respectively illustrate a plan view of a display part of a pixel in a portion of a display area of a display device according to an embodiment of the present invention.
Figure 3:
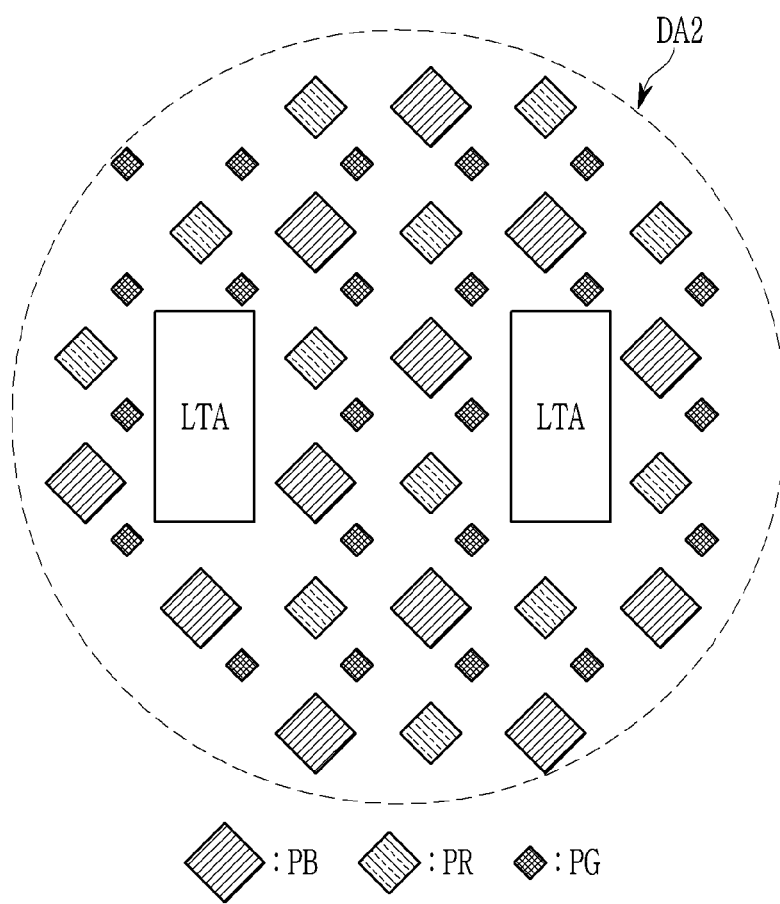
Figure 4:
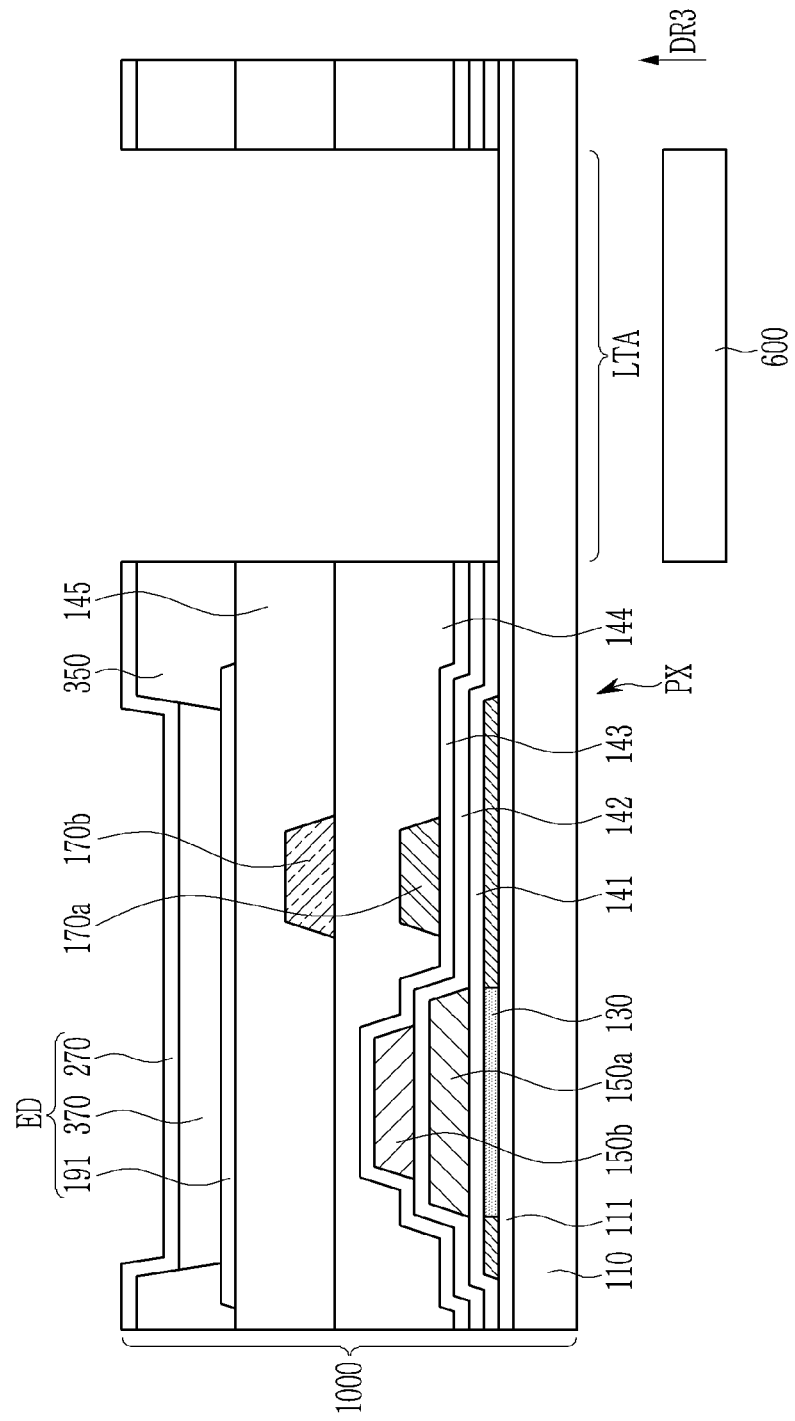
FIG. 4 illustrates a cross-sectional view of a display device according to an embodiment of the present invention.

FIG. 1 illustrates a plan view of a display device according to an embodiment of the present invention, FIG. 2 and FIG. 3 respectively illustrate a plan view of a display part of a pixel in a portion of a display area of a display device according to an embodiment of the present invention, and FIG. 4 illustrates a cross-sectional view of a display device according to an embodiment of the present invention.

Referring to FIG. 1 to FIG. 3, a display panel 1000 included in a display device according to an embodiment includes a display area DA that may display an image, and a peripheral area PA disposed around the display area DA.

The display area DA may include a first display area DA1 and a second display area DA2. The second display area DA2 may have a smaller area than the first display area DA1. The first display area DA1 may be disposed between the second display area DA2 and the peripheral area PA in a second direction DR2. That is, the second display area DA2 may be spaced apart from the peripheral area PA in the second direction DR2. Specifically, the first display area DA1 may be disposed between the second display area DA2 and a lower peripheral area PA in a plan view, and the first display area DA1 may also be disposed between the second display area DA2 and an upper peripheral area PA in a plan view, referring to FIG. 1.

FIG. 1 illustrates that the second display area DA2 is substantially circular, but the present invention is not limited thereto, and the second display area DA2 may have various shapes such as a polygonal shape in another exemplary embodiment.

The first display area DA1 may include a plurality of pixels PX. Each pixel PX may include a pixel circuit part including at least one transistor, and a display part in which a pixel electrode connected to the pixel circuit part is disposed and that may emit light.

FIG. 2 exemplarily illustrates display parts PB, PR, and PG included in the plurality of pixels PX disposed in the first display area DA1. For example, the display part PB may emit blue light, the display part PR may emit red light, and the display part PG may emit green light. The colors represented by the display parts PB, PR, and PG are not limited thereto, and may be various combinations of basic colors in another exemplary embodiment. That is, the display device may display images of various colors with a combination of different primary colors represented by the plurality of display parts PB, PR, and PG.

The second display area DA2 may include at least one pixel PX and at least one light-transmitting portion LTA. Referring to FIG. 3, the arrangement of the pixels PX of the second display area DA2 in an area excluding the light-transmitting portion LTA may be the same or similar to that of the pixels PX of the first display area DA1. In some embodiments, the pixel arrangement of the second display area DA2 and the pixel arrangement of the first display area DA1 may be different. For example, the second display area DA2 may have a pixel arrangement structure of each RGB stripe type, while the first display area DA1 may have a pentile structure of pixel arrangement as shown in FIG. 2. In the RGB stripe type of pixel arrangement structure, the display part of each pixel PX may have a substantially rectangular shape, and the pixels PX displaying the same color may be arranged in each pixel column, while pixel columns displaying different colors may be alternately arranged in a pixel row direction.

The pixel PX is not disposed in the light-transmitting portion LTA. Light may pass through the display panel 1000 in a third direction DR3 through the light-transmitting portion LTA. FIG. 3 illustrates that only two light-transmitting portions LTA are disposed in the second display area DA2, but the arrangement and the number of light-transmitting portions LTA are not limited thereto. For example, the plurality of light-transmitting portions LTA may be arranged substantially in a matrix form in the second display area DA2. In this case, the pixel PX may be disposed between adjacent light-transmitting portions LTA.

A circuit part, a signal line, a voltage line, and a pad part may be disposed in the peripheral area PA. In FIG. 1, a driving circuit part 500 may be disposed in the lower peripheral area PA in a plan view. The driving circuit part 500 may have various forms such as at least one driving circuit chip, a flexible printed circuit film, and a printed circuit board.

A cross-sectional structure of a display device according to an embodiment will be described with reference to FIG. 4 together with FIG. 1 to FIG. 3.

The display device according to the embodiment may include the display panel 1000 and at least one optical member 600 disposed below the display panel 1000. The optical member 600 may include a camera, a flash, a sensor, or the like.

The optical member 600 may emit light through the transmitting part LTA of the display panel 1000, or may receive light incident through the transmitting part LTA.

The display panel 1000 according to the embodiment may include an insulating substrate 110 on which the first display area DA1 and the second display area DA2 described above are disposed.

A buffer layer 111 may be disposed on the substrate 110. The buffer layer 111 may be omitted.

An active layer 130 may be disposed on the buffer layer 111. The active layer 130 may include semiconductor materials such as polycrystalline silicon and an oxide semiconductor. The active layer 130 may include areas having different carrier concentrations from each other.

An insulating layer 141 may be disposed on the active layer 130, and a first conductive layer 150a may be disposed on the insulating layer 141.

An insulating layer 142 may be disposed on the first conductive layer 150a, and a second conductive layer 150b may be disposed on the insulating layer 142.

An insulating layer 143 may be disposed on the second conductive layer 150b, and a third conductive layer 170a may be disposed on the insulating layer 143.

An insulating layer 144 may be disposed on the third conductive layer 170a, and a fourth conductive layer 170b may be disposed on the insulating layer 144.

At least one of the first, second, third, and fourth conductive layers 150a, 150b, 170a, and 170b may include at least one of copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (Ti), chromium (Cr), tantalum (Ta), and an alloy thereof, but the invention is not limited thereto.

The first conductive layer 150a, the second conductive layer 150b, the third conductive layer 170a, and the fourth conductive layer 170b may be patterned and electrically connected to each other to form the pixel circuit part of the pixel PX.

An insulating layer 145 may be disposed on the fourth conductive layer 170b, and a pixel electrode 191 may be disposed on the insulating layer 145.

At least one of the buffer layer 111, the insulating layer 141, the insulating layer 142, the insulating layer 143, the insulating layer 144, and the insulating layer 145 includes an inorganic insulating material such as a silicon nitride (SiNx) or a silicon oxide (SiOx), and/or an organic insulating material. Particularly, the insulating layer 145 may include an organic insulating material such as a polyacrylic resin or a polyimide resin, and an upper surface of the insulating layer 145 may be substantially flat.

An insulating layer 350 may be disposed on the insulating layer 145 and the pixel electrode 191. The insulating layer 350 is also referred to as a pixel defining layer. The insulating layer 350 may define an opening provided on the pixel electrode 191. The insulating layer 350 may include a pigment such as carbon black.

A light emitting layer 370 may be disposed on the pixel electrode 191. The light emitting layer 370 may include a portion disposed in the opening defined by the insulating layer 350. The light emitting layer 370 may include an organic light emitting material or an inorganic light emitting material.

A common electrode 270 may be disposed on the light emitting layer 370.

The pixel electrode 191, the light emitting layer 370, and the common electrode 270 may together form a light emitting diode ED. The display part of the pixel PX may include the light emitting diode ED.

Here, the case in which the display panel 1000 is a light emitting display panel is described as an example, but the structure of the display panel 1000 is not limited thereto. For example, the display panel 1000 may be a liquid crystal display panel, an electrophoretic display panel, or an electrowetting display panel. In addition, the display panel 1000 may be one of various display panels such as a micro LED display panel, a quantum dot light emitting diode ("QLED") display panel, and a quantum dot organic light emitting diode ("QD-OLED") display panel.

An encapsulation layer for protecting the light emitting diode ED may be further disposed on the common electrode 270. The encapsulation layer may include an inorganic layer and an organic layer that are alternately stacked. In some embodiments, the encapsulation layer may include a substrate. The substrate 110 and the substrate of the encapsulation layer may include glass. In this case, the substrate 110 and the encapsulation layer may be bonded to each other through a sealant therebetween, and thus a gap between the encapsulation layer and the substrate 110 may be sealed.

Referring to FIG. 4, the light-transmitting portion LTA may not include the configuration of the pixel PX described above, that is, the pixel circuit part and the display part. A layer through which light is not transmitted well, such as the first conductive layer 150a, the second conductive layer 150b, the third conductive layer 170a, and the fourth conductive layer 170b, may not be disposed in the light-transmitting portion LTA. FIG. 4 illustrates an example in which only the buffer layer 111 is disposed in the light-transmitting portion LTA, but the present invention is not limited thereto. In another exemplary embodiment, at least some of the other insulating layers 141, 142, 143, 144, 145, and 350 may remain without being eliminated. Unlike the example of FIG. 4, the buffer layer 111 may also be eliminated from the light-transmitting portion LTA in still another exemplary embodiment.

The optical member 600 disposed below the display panel 1000 may output light through the light-transmitting portion LTA of the display panel 1000 or receive light incident through the light-transmitting portion LTA. FIG. 4 illustrates a case in which the optical member 600 corresponds to one light-transmitting portion LTA, but the present invention is not limited thereto. In another exemplary embodiment, the optical member 600 may overlap and correspond to a plurality of light-transmitting portions LTA.

Hereinafter, a structure of a signal line of a display device according to an embodiment of the present invention will be described with reference to FIG. 5 to FIG. 8 together with FIG. 1 to FIG. 4 described above.

Figure 5:
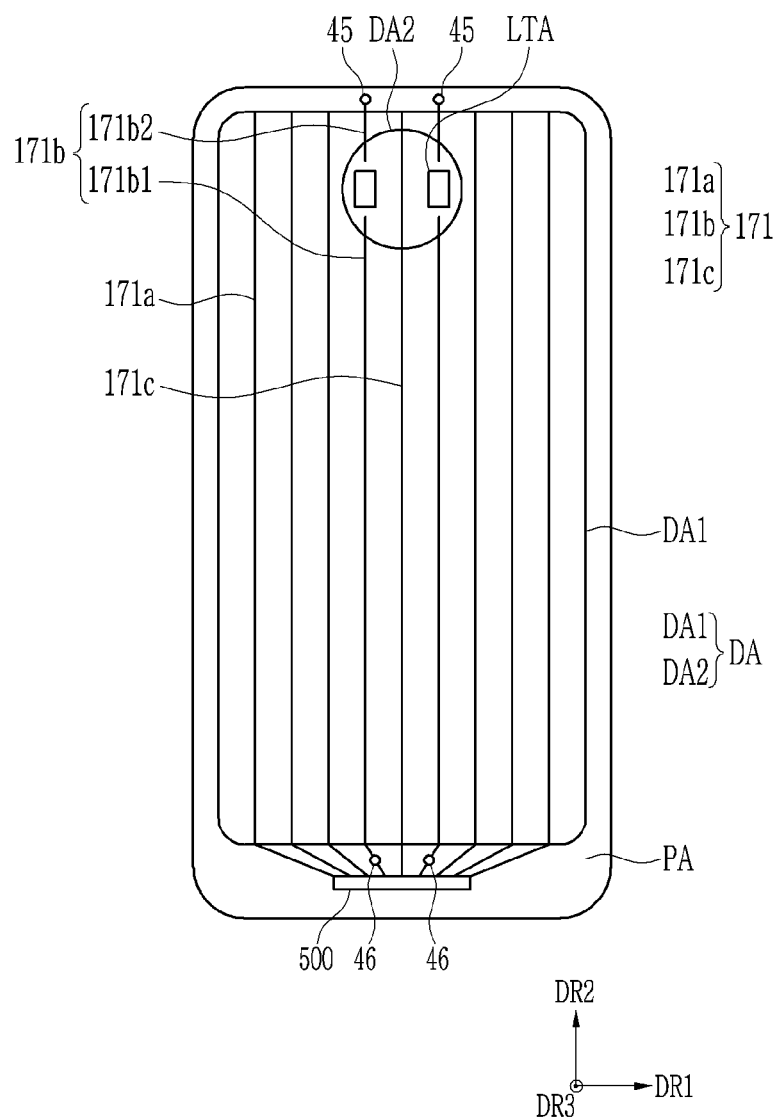
FIG. 5, FIGS. 6, and 7 respectively illustrate a plan view of a display device according to an embodiment of the present invention.
Figure 6:
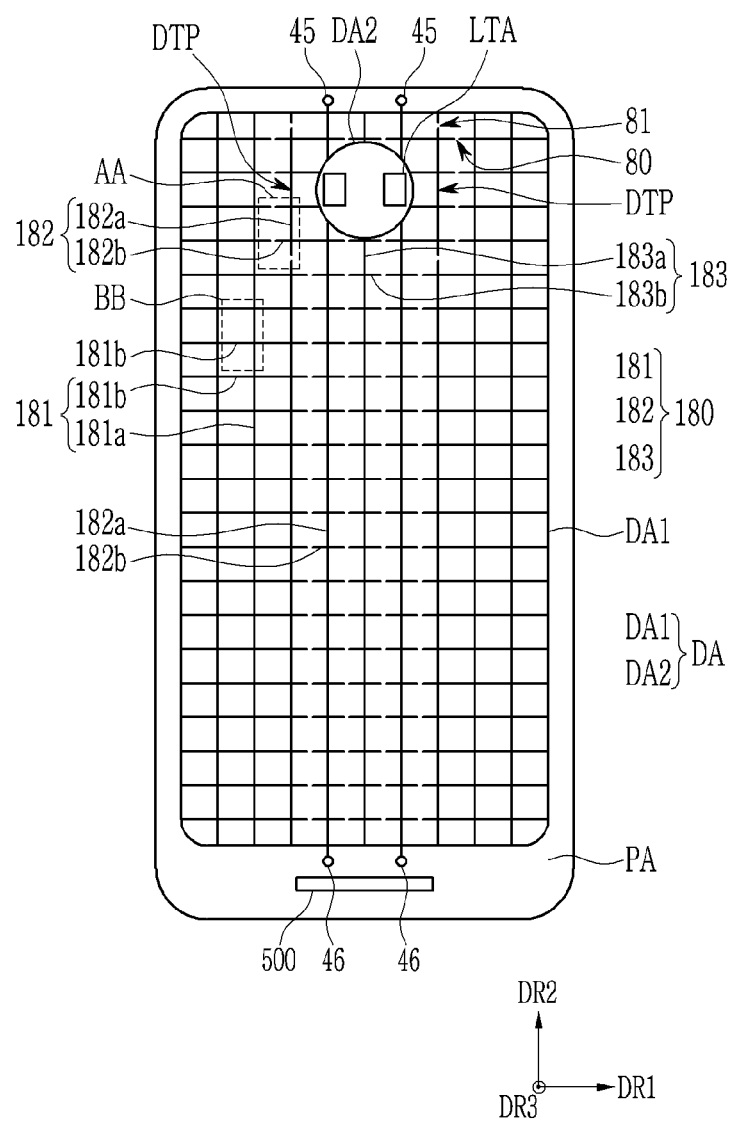
Figure 7:
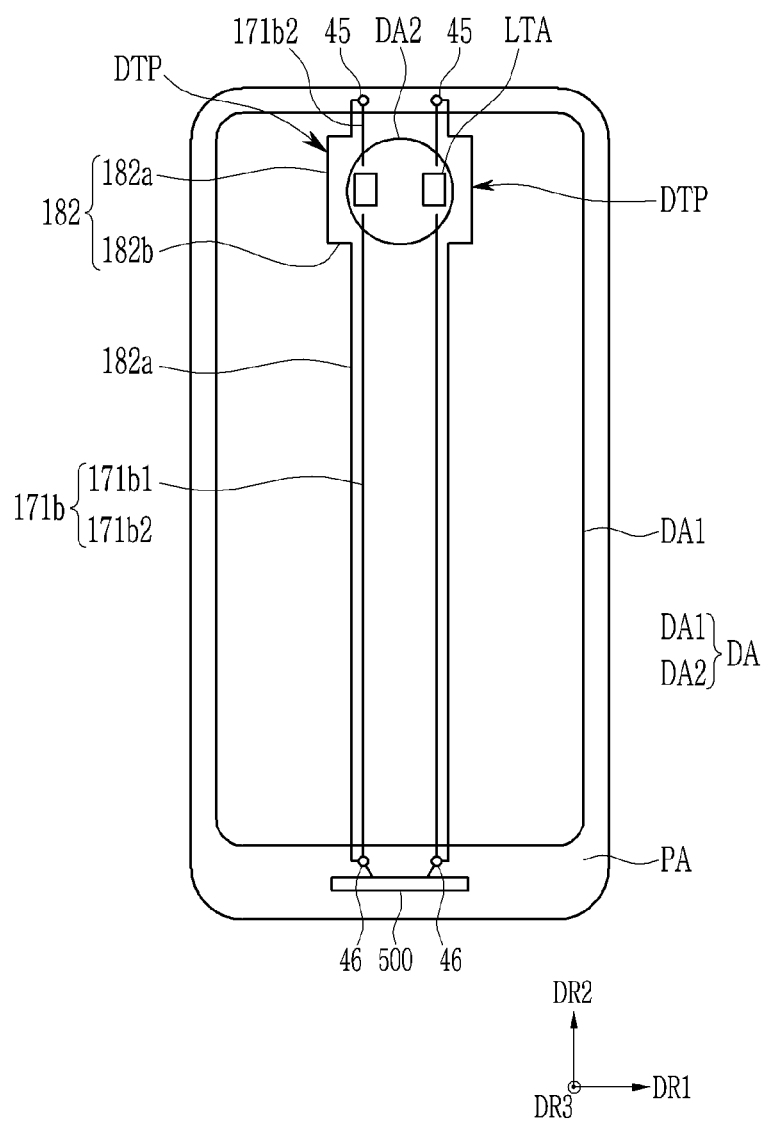
Figure 8:
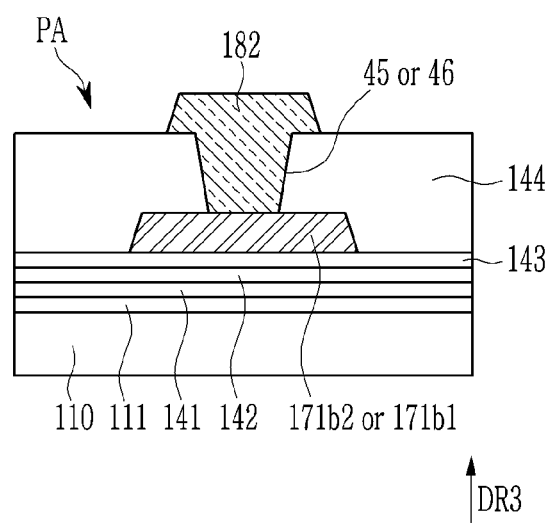
FIG. 8 illustrates a cross-sectional view around a contact hole of the display device illustrated in FIG. 7.

FIG. 5, FIGS. 6, and 7 respectively illustrate a plan view of a display device according to an embodiment of the present invention, and FIG. 8 illustrates a cross-sectional view around a contact hole of the display device illustrated in FIG. 7.

Referring to FIG. 5, the display device according to the embodiment of the present invention may include the display panel as described above.

The display area DA may include a plurality of data lines 171. Each data line 171 may substantially extend in the second direction DR2 in the display area DA. The data line 171 may be extended to the lower peripheral area PA in a plan view and be electrically connected to the driving circuit part 500 to receive a data signal.

Each data line 171 may be electrically connected to a transistor of the pixel circuit part adjacent thereto to transmit a data signal to the pixel circuit part.

The plurality of data lines 171 may include a first data line 171a that neither meet the second display area DA2, passes the second display area DA2, nor overlap the second display area DA2 in the second direction DR2; a second data line 171b that meets and overlaps a portion of the second display area DA2 or is adjacent to the second display area DA2 in the second direction DR2; and a third data line 171c passing through the second display area DA2.

The first data line 171a may include a data line disposed at the left side of the second display area DA2 and a data line disposed at the right side of the second display area DA2. The first data line 171a may continuously extend in the second direction DR2 in the first display area DA1.

The second data line 171b may include a first portion 171b1 disposed below the second display area DA2 in a plan view and a second portion 171b2 disposed above the second display area DA2 in a plan view. The first portion 171b1 and the second portion 171*b*2 of the second data line 171*b* may be spaced apart in the second direction DR2. Extension lines of each of the first portion 171*b*1 and the second portion 171*b*2 corresponding to each other may be disposed on the same straight line.

As shown in FIG. 5, at least one of the first portion 171*b*1 and the second portion 171*b*2 of the second data line 171*b* may include a portion extending to the inside of the second display area DA2. The light-transmitting portion LTA may be disposed between the first portion 171*b*1 and the second portion 171*b*2 of the second data line 171*b*. That is, the first portion 171*b*1 and the second portion 171*b*2 of the second data line 171*b* may be spaced apart with the light-transmitting portion LTA therebetween.

The first portion 171*b*1 and the second portion 171*b*2 of the second data line 171*b* may be disposed at the same conductive layer on the substrate 110 described above, and may include the same material. For example, the first portion 171*b*1 and the second portion 171*b*2 of the second data line 171*b* may be disposed at the third conductive layer 170*a* of the embodiment illustrated in FIG. 4 described above.

The first portion 171*b*1 of the second data line 171*b* may be electrically connected to another conductive layer through an opening 46 in the lower peripheral area PA, and the second portion 171*b*2 of the second data line 171*b* may be electrically connected to another conductive layer through an opening 45 in the upper peripheral area PA 45.

The third data line 171*c* may continuously extend in the second direction DR2 through the second display area DA2. Although FIG. 5 illustrates that the number of the third data line 171*c* is one, the number of the third data lines 171*c* may be two or more in another exemplary embodiment.

The first data line 171*a* and the third data line 171*c* may also be disposed at the third conductive layer 170*a* like the second data line 171*b*.

Referring to FIG. 6, the first display area DA1 may include a conductive pattern 180. The conductive pattern 180 may be patterned in a mesh form.

The conductive pattern 180 may include a pattern portion 181 and a pattern portion 182.

The pattern portion 181 may include a vertical portion 181*a* substantially extending in the second direction DR2 and a horizontal portion 181*b* substantially extending in a first direction DR1. The vertical portion 181*a* and the horizontal portion 181*b* may be physically and electrically connected to each other, and may together receive a constant voltage.

The pattern portion 181 may be spaced apart from the second display area DA2.

The pattern portion 181 and the pattern portion 182 adjacent to each other are spaced apart from each other with separation portions 80 and 81, which are portions in which the conductive pattern 180 is eliminated, therebetween, and the pattern portion 181 and the pattern portion 182 are electrically insulated from each other.

The pattern portion 182 may include a vertical portion 182*a* substantially extending in the second direction DR2 and a horizontal portion 182*b* substantially extending in the first direction DR1. The vertical portion 182*a* and the horizontal portion 182*b* may be physically and electrically connected to each other.

The pattern portion 182 may include a bypass portion DTP that is disposed between the pattern portion 181 and the second display area DA2 and that bypasses (i.e., detours around) a periphery of the second display area DA2 in a plan view.

In FIG. 6, the pattern portion 182 may extend in the lower peripheral area PA in a plan view to be electrically connected to the first portion 171*b*1 of the second data line 171*b* through the opening 46, and may also extend in the upper peripheral area PA in a plan view to be electrically connected to the second portion 171*b*2 of the second data line 171*b* through the opening 45. One end of the pattern portion 182 may be electrically connected to the first portion 171*b*1 of the second data line 171*b*, and the other end of the pattern portion 182 may be electrically connected to the second portion 171*b*2 of the second data line 171*b*.

The conductive pattern 180 may further include a pattern portion 183 spaced apart from the pattern portion 181 and the pattern portion 182. The pattern portion 183 may include a vertical portion 183*a* substantially extending in the second direction DR2 and a horizontal portion 183*b* substantially extending in the first direction DR1. The vertical portion 183*a* and the horizontal portion 183*b* may be physically and electrically connected to each other, and may together receive a constant voltage.

The pattern portion 182 and the pattern portion 183 adjacent to each other are spaced apart from each other with the separation portions 80 and 81 therebetween, and are electrically insulated from each other.

The pattern portion 183 may not be disposed in the second display area DA2.

The pattern portion 181, the pattern portion 182, and the pattern portion 183 of the conductive pattern 180 may be disposed at the same conductive layer on the substrate 110 described above, and may include the same material. For example, the conductive pattern 180 may be disposed at the fourth conductive layer 170*b* of the embodiment shown in FIG. 4 described above.

FIG. 7 illustrates the first portion 171*b*1 and the second portion 171*b*2 of the second data line 171*b* illustrated in FIG. 5 together with a portion of the pattern portion 182 illustrated in FIG. 6. In the pattern portion 182, the horizontal portion 182*b* that extends from only one vertical portion 182*a* and having one end ending at the separation portion 80 is omitted in FIG. 7.

Referring to FIG. 7, the bypass portion DTP of the pattern portion 182 may include a vertical portion 182*a* adjacent to the second display area DA2, and a pair of horizontal portions 182*b* extending from upper and lower ends of the vertical portion 182*a*.

As described above, the first portion 171*b*1 of the second data line 171*b* may be electrically connected to the pattern portion 182 through the opening 46 in the lower peripheral area PA in a plan view, and the second portion 171*b*2 of the second data line 171*b* may be electrically connected to the pattern portion 182 through the opening 45 in the upper peripheral area PA in a plan view.

Reference to FIG. 8 together with FIG. 4 described above, the first portion 171*b*1 and the second portion 171*b*2 of the second data line 171*b* may be disposed at the third conductive layer 170*a* on the insulating layer 143, and the insulating layer 144 may define the opening 46 provided on the first portion 171*b*1 of the second data line 171*b* and the opening 45 disposed on the second portion 171*b*2 of the second data line 171*b*. The pattern portion 182 may be electrically connected to the second portion 171*b*2 and the first portion 171*b*1 of the second data line 171*b* through respective openings 45 and 46.

The first portion 171*b*1 of the second data line 171*b* may receive a data signal from the driving circuit part 500, and it may transmit the data signal to a pixel of the first display area DA1 disposed at the lower side of the second display area DA2 in a plan view in FIG. 7 and to a pixel disposed at the lower side of the light-transmitting portion LTA in a plan view among pixels disposed in the second display area DA2.

In FIG. 7, the second portion 171b2 of the second data line 171b is disposed in the first display area DA1 disposed at the upper side of the second display area DA2 in a plan view, but the second portion 171b2 is spaced apart from the first portion 171b1 with the light-transmitting portion LTA therebetween. Thus, the second portion 171b2 may not directly receive the data signal from the first portion 171b1.

The pattern portion 182 according to the present embodiment may be electrically connected to the first portion 171b1 of the second data line 171b in the lower peripheral area PA in a plan view to transmit a data signal, and it may be electrically connected to the second portion 171b2 of the second data line 171b in the upper peripheral area PA in a plan view through the bypass portion DTP of the pattern portion 182. Accordingly, the second portion 171b2 of the second data line 171b may receive a data signal from the first portion 171b1 of the second data line 171b or the driving circuit part 500 through the pattern portion 182. Therefore, the data signal may be transmitted to the pixel circuit part of the pixels in the first display area DA1 and the second display area DA2 connected to the second portion 171b2 of the second data line 171b.

When the data line is bypassed around the light-transmitting portion LTA in the second display area DA2, an area of the light-transmitting portion LTA may be reduced by the data lines densely disposed in the second display area DA2. Since a portion in which a large number of data lines are densely disposed in a small area occurs, an unwanted change of the data signal may be caused due to coupling between the data lines. However, according to the embodiment of the present invention, since there is no such problem, a sufficient area of the light-transmitting portion LTA can be secured, and since the data lines do not need to be densely disposed, influence due to coupling between the data lines may be reduced.

Referring to FIG. 6, since the pattern portion 181 and the pattern portion 183 having a pattern similar to the pattern portion 182 are provided in the first display area DA1, it is possible to prevent only the pattern portion 182 from being partially viewed. In order to further prevent the conductive pattern 180 from being viewed from the outside, the insulating layer 350 disposed on the fourth conductive layer 170b may include a pigment such as carbon black.

The pattern portion 181 and the pattern portion 183 may be applied with a constant voltage to not be floated. Accordingly, since it is possible to prevent a voltage of other adjacent conductors from being affected as potentials of the pattern portion 181 and the pattern portion 183 are changed by coupling with another conductor adjacent thereto, it is possible to prevent display characteristics of the display device from deteriorating.

In some embodiments of the present invention, the horizontal portions 181b, 182b, and 183b of the conductive pattern 180 may be omitted.

Hereinafter, a specific structure of a display device according to an embodiment of the present invention will be described with reference to FIG. 9 to FIG. 12 together with the drawings described above.

Figure 9:
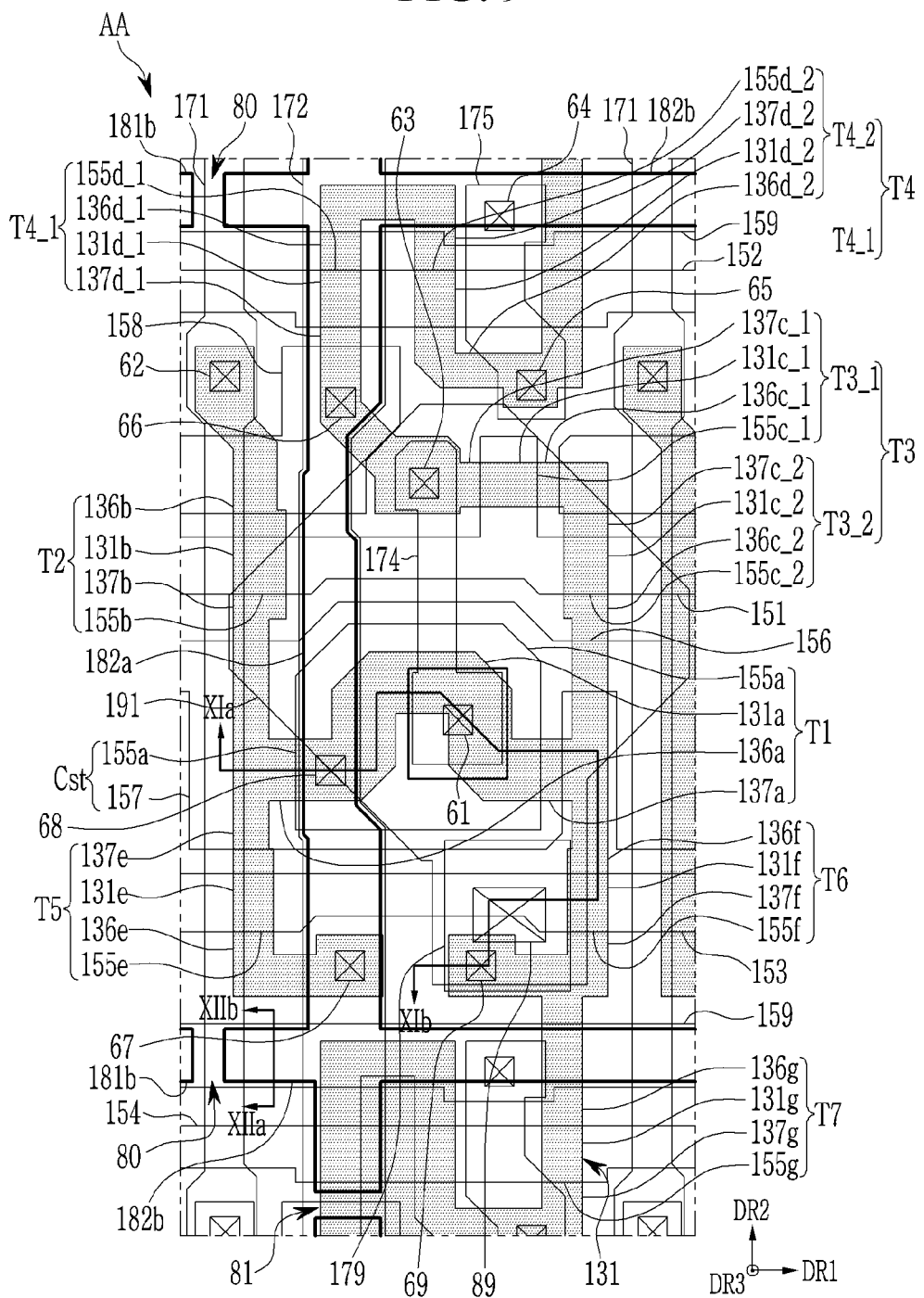
FIG. 9 and FIG. 10 respectively illustrate a plan view of a pixel of a display device according to an embodiment of the present invention.
Figure 10:
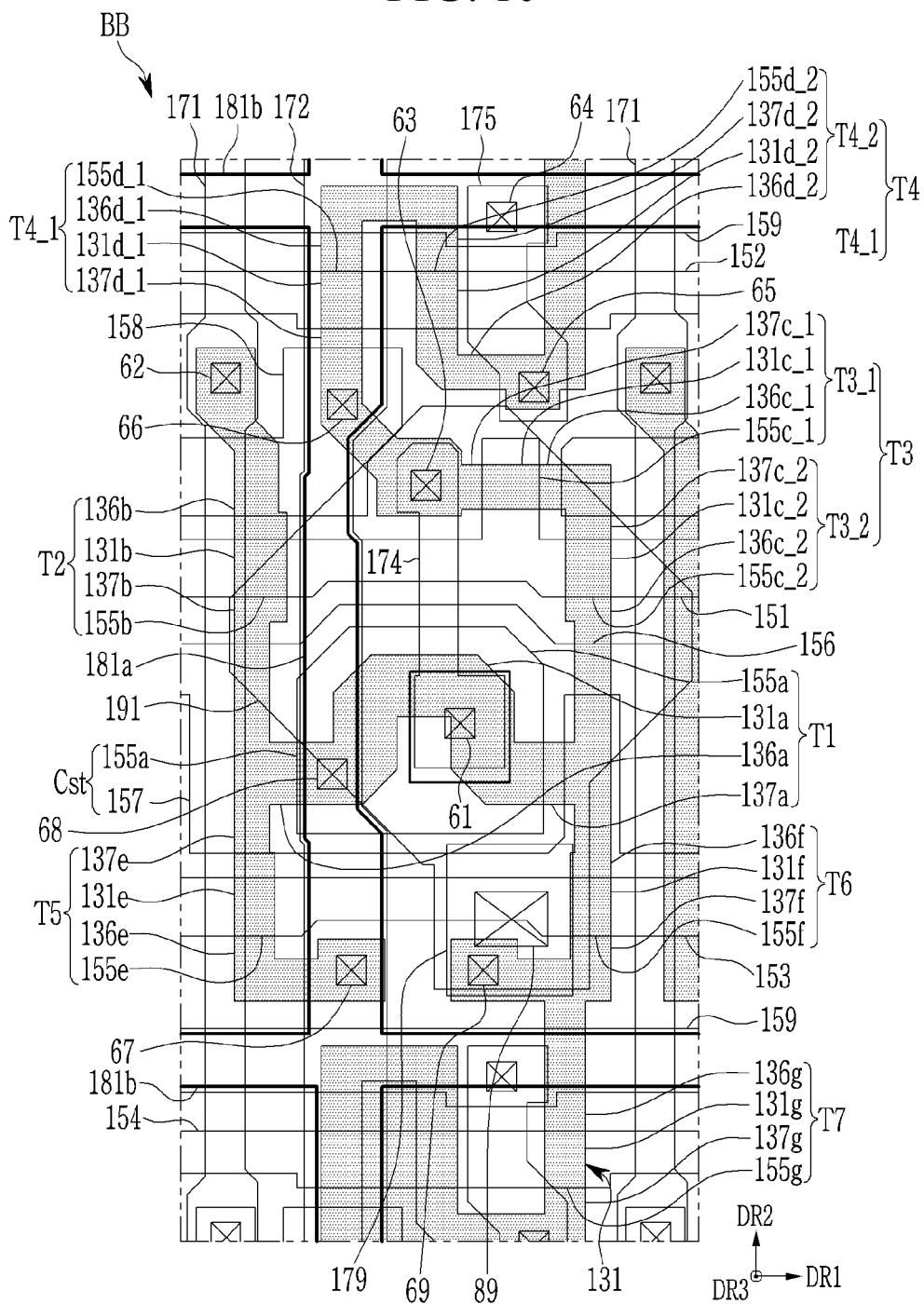
Figure 11:
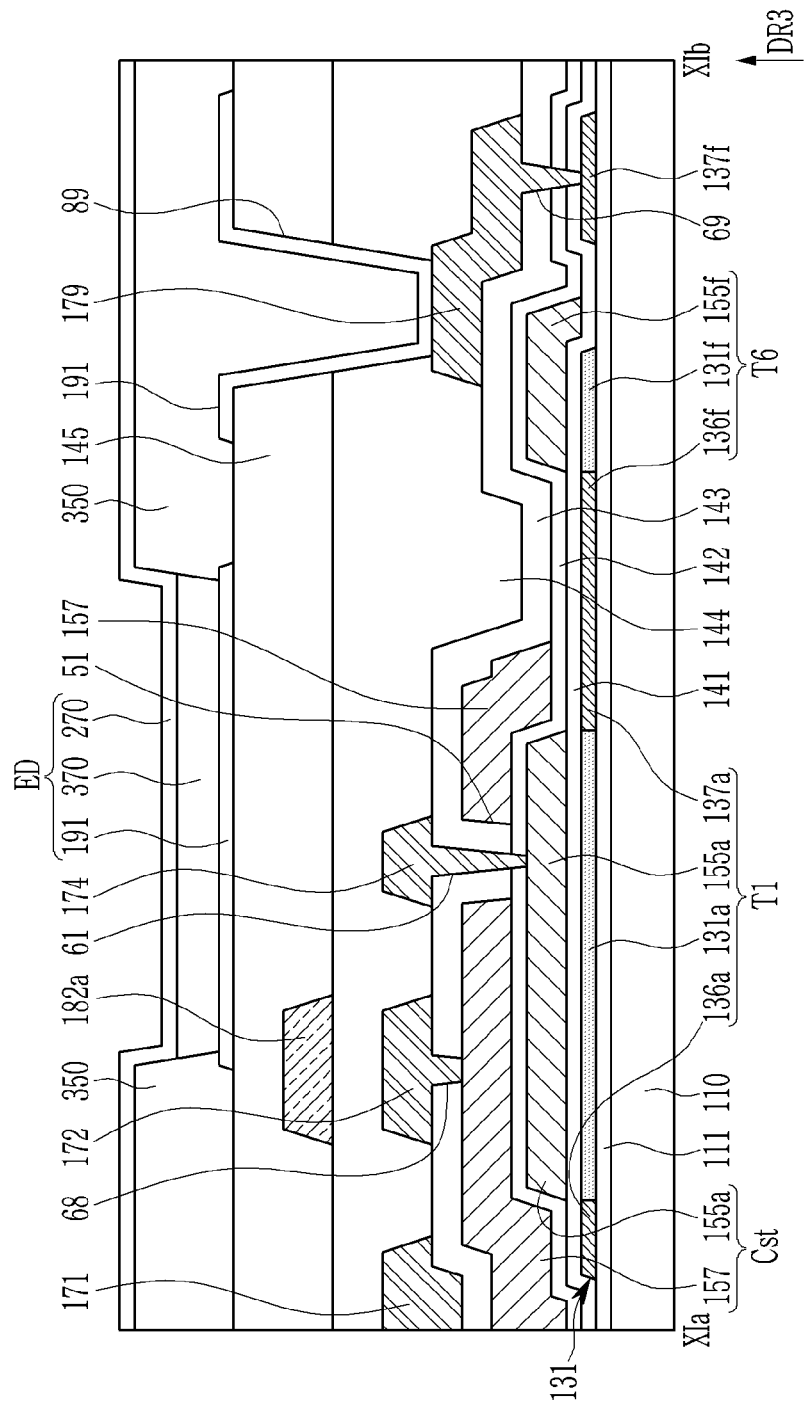
FIG. 11 illustrates a cross-sectional view taken along line XIa-XIb of the display device shown in FIG. 9.
Figure 12:
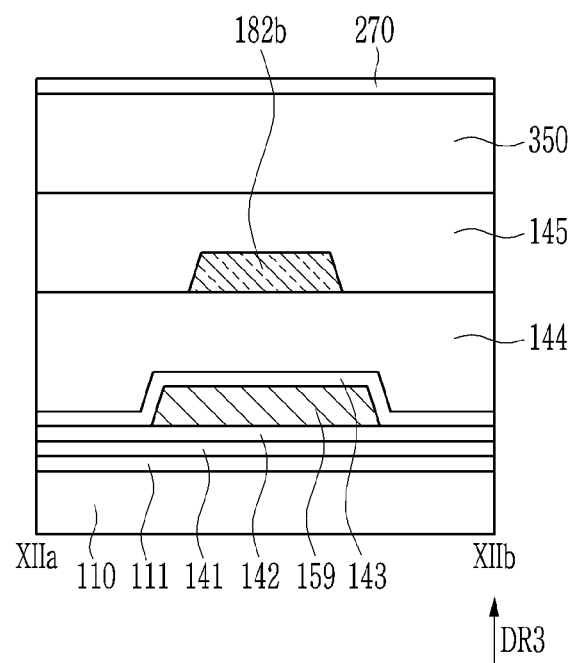
FIG. 12 illustrates a cross-sectional view taken along line XIIa-XIIb of the display device illustrated in FIG. 9.

FIG. 9, which is a plan view of a pixel of a display device according to an embodiment of the present invention, illustrates a specific view of area AA of FIG. 6 described above; FIG. 10, which is a plan view of a pixel of a display device according to an embodiment of the present invention, illustrates a specific view of area BB of FIG. 6 described above; FIG. 11 illustrates a cross-sectional view taken along line XIa-XIb of the display device shown in FIG. 9; and FIG. 12 illustrates a cross-sectional view taken along line XIIa-XIIb of the display device illustrated in FIG. 9.

The structure illustrated in FIG. 9 and the structure illustrated in FIG. 10 are identical to each other except for the structures of the pattern portion 181 and the pattern portion 182.

Referring to FIG. 9 to FIG. 12, each pixel circuit part of the display device according to the embodiment may include a plurality of transistors T1, T2, T3, T4, T5, T6, and T7 and a capacitor Cst, and the display part may include the light emitting diode ED.

The display device according to the embodiment may include the substrate 110, and the buffer layer 111 may be disposed on the substrate 110.

An active pattern 131 that is disposed in the same layer as the active layer 130 as described above and that includes the same material as the active layer 130 may be disposed on the buffer layer 111.

The active pattern 131 includes channel regions 131a, 131b, 131c_1, 131c_2, 131d_1, 131d_2, 131e, 131f, and 131g that forms a channel of each of the plurality of transistors T1, T2, T3, T4, T5, T6, and T7 included in one pixel circuit part, and a conductive region. The active pattern 131 may be bent to have various shapes.

The conductive region of the active pattern 131 is disposed at respective sides of each channel region 131a, 131b, 131c_1, 131c_2, 131d_1, 131d_2, 131e, 131f, or 131g, and the conductive region of the active pattern 131 has a higher carrier concentration than that of the channel region 131a, 131b, 131c_1, 131c_2, 131d_1, 131d_2, 131e, 131f, or 131g. A pair of conductive regions disposed on respective sides of the channel region 131a, 131b, 131c_1, 131c_2, 131d_1, 131d_2, 131e, 131f, or 131g of each transistor T1, T2, T3, T4, T5, T6, or T7 may be a source region and a drain region of the corresponding transistor T1, T2, T3, T4, T5, T6, or T7.

The insulating layer 141 may be disposed on the active pattern 131, and the first conductive layer as described above may be disposed on the insulating layer 141.

The first conductive layer may include scan lines 151, 152, and 154 that may transmit a scan signal, a control line 153 that may transmit a light emitting control signal, and a driving gate electrode 155a. The scan lines 151, 152, and 154 and the control line 153 may substantially extend long in the first direction DR1 in a plan view.

The first transistor T1 includes a channel region 131a of the active pattern 131, a source region 136a and a drain region 137a disposed at opposite sides of the channel region 131a, and a driving gate electrode 155a overlapping the channel region 131a in a plan view.

The second transistor T2 may include the channel region 131b of the active pattern 131, a source region 136b and a drain region 137b disposed at opposite sides of the channel region 131b, and a gate electrode 155b that overlaps the channel region 131b in a plan view and is a portion of the scan line 151. The drain region 137b is connected to the source region 136a of the first transistor T1.

The third transistor T3 may include an upper third transistor T3_1 and a lower third transistor T3_2 that are adjacent to each other and connected to each other.

The upper third transistor T3_1 includes the channel region 131c_1 overlapping the scan line 151 in a plan view, a source region 136c_1 and a drain region 137c_1 at opposite sides of the channel region 131c_1, and a gate electrode 155c_1 that overlaps the channel region 131c_1 and is a portion of a protrusion of the scan line 151.

The lower third transistor T3_2 includes the channel region 131c_2 overlapping the scan line 151 in a plan view, a source region 136c_2 and a drain region 137c_2 disposed at opposite sides of the channel region 131c_2, and a gate electrode 155c_2 that overlaps the channel region 131c_2 and is a portion of the scan line 151. The source region 136c_2 of the lower third transistor T3_2 is connected to the drain region 137a of the first transistor T1, and the drain region 137c_2 of the lower third transistor T3_2 is connected to the source region 136c_1 of the upper third transistor T3_2. The fourth transistor T4 may include a left fourth transistor T4_1 and a right fourth transistor T4_2 that are adjacent to each other and connected to each other.

The left fourth transistor T4_1 includes the channel region 131d_1 overlapping the scan line 152 in a plan view, a source region 136d_1 and a drain region 137d_1 disposed at opposite sides of the channel region 131d_1, and a gate electrode 155d_1 that overlaps the channel region 131d_1 and is a portion of the scan line 152. The drain region 137d_1 is connected to the drain region 137c_1 of the upper third transistor T3_1.

The right fourth transistor T4_2 includes the channel region 131d_2 overlapping the scan line 152 in a plan view, a source region 136d_2 and a drain region 137d_2 disposed at opposite sides of the channel region 131d_2, and a gate electrode 155d_2 that overlaps the channel region 131d_2 and is a portion of the scan line 152. The drain region 137d_2 is connected to the source region 136d_1 of the left fourth transistor T4_1.

The fifth transistor T5 may include the channel region 131e, a source region 136e and a drain region 137e disposed at opposite sides of the channel region 131e, and a gate electrode 155e that overlaps the channel region 131e and is a portion of the control line 153. The drain region 137e is connected to the source region 136a of the first transistor T1.

The sixth transistor T6 includes the channel region 131f, a source region 136f and a drain region 137f disposed at opposite sides of the channel region 131f, and a gate electrode 155f that overlaps the channel region 131f and is a portion of the control line 153. The source region 136f is connected to the drain region 137a of the first transistor T1.

The seventh transistor T7 includes the channel region 131g, a source region 136g and a drain region 137g disposed at opposite sides of the channel region 131g, and a gate electrode 155g that overlaps the channel region 131g and is a portion of the scan line 154. The source region 136g is connected to the drain region 137f of the sixth transistor T6.

The insulating layer 142 may be disposed on the first conductive layer, and the second conductive layer as described above may be disposed on the insulating layer 142.

The second conductive layer may include a storage line 156, an initializing voltage line 159, and a shielding pattern 158.

The storage line 156 and the initializing voltage line 159 may substantially extend long in the first direction DR1 in a plan view.

The storage line 156 may include an extension 157 disposed in each pixel circuit part.

The driving gate electrode 155a and the extension 157 of the storage line 156 may overlap each other with the insulating layer 142 therebetween to form the capacitor Cst.

The initializing voltage line 159 may transmit an initializing voltage.

The shielding pattern 158 may be omitted in another exemplary embodiment.

The insulating layer 143 may be disposed on the second conductive layer.

Some or all of the insulating layers 141, 142, and 143 may be eliminated to define openings 61, 62, 63, 64, 65, 66, 67, 68, and 69.

The third conductive layer as described above may be disposed on the insulating layer 143. The third conductive layer may include the data line 171 as described above, a driving voltage line 172 that may transmit a driving voltage, and connecting members 174, 175, and 179.

The data line 171 and the driving voltage line 172 may substantially extend long in the second direction DR2 in a plan view, and cross the plurality of scan lines 151, 152, and 154, the control line 153, the initializing voltage line 159, and the storage line 156.

The data line 171 may be electrically connected to the source region 136b of the second transistor T2 through the opening 62.

The driving voltage line 172 may be electrically connected to the source region 136e of the fifth transistor T5 through the opening 67, and may be electrically connected to the extension 157 of the storage line 156 through the opening 68 to transmit a driving voltage to the extension 157. The driving voltage line 172 may be electrically connected to the shielding pattern 158 through the opening 66 to transmit a driving voltage to the shielding pattern 158.

The connecting member 174 may be electrically connected to the driving gate electrode 155a through the opening 61, and may be electrically connected to the drain region 137c_1 of the third transistor T3 and the drain region 137d_1 of the fourth transistor T4 through the opening 63.

The connecting member 175 may be electrically connected to the initializing voltage line 159 through the opening 64, and may be electrically connected to the source region 136d_2 of the fourth transistor T4 and the drain region 137g of the seventh transistor T7 through the opening 65. Accordingly, an initializing voltage may be applied to the source region 136d_2 of the fourth transistor T4 and the drain region 137g of the seventh transistor T7 through the connecting member 175.

The connecting member 179 may be electrically connected to the drain region 137f of the sixth transistor T6 through the opening 69.

The insulating layer 144 may be disposed on the third conductive layer.

The fourth conductive layer as described above may be disposed on the insulating layer 144. The conductive pattern 180 as described above may be disposed at the fourth conductive layer. FIG. 9 to FIG. 12 illustrate the horizontal portion 181b and the vertical portion 181a of the pattern portion 181 included in the conductive pattern 180, and the vertical portion 182a and the horizontal portion 182b included in the pattern portion 182.

Referring to FIG. 9 to FIG. 12, the vertical portions 181a and 182a of the conductive pattern 180 overlap the driving voltage line 172 transmitting a driving voltage in a plan view, and may extend along the driving voltage line 172. The horizontal portions 181b and 182b of the conductive pattern 180 overlap the initializing voltage line 159 that transmits an initializing voltage in a plan view, and may extend along the initializing voltage line 159. Accordingly, the horizontal portions 181b and 182b and the vertical portions 181a and 182a of the conductive pattern 180 together with another conductive layer adjacent thereto form a parasitic capacitor, so that coupling that affects each other's signals or voltages may be prevented.

Particularly, the horizontal portion 182b and the vertical portion 182a of the pattern portion 182 that may transmit a data signal may change the data signal or affect a voltage or signal of the adjacent signal line, due to crosstalk with the adjacent signal line. However, according to the present embodiment, since the horizontal portion 182b and the vertical portion 182a of the pattern portion 182 overlap the driving voltage line 172 or the initializing voltage line 159 transmitting a constant voltage, an electric field may be shielded, thereby preventing a parasitic capacitance from occurring between them and surrounding signal lines.

The pattern portion 181 and the pattern portion 183 of the conductive pattern 180 may receive and transmit a driving voltage. The pattern portion 181 and the pattern portion 183 of the conductive pattern 180 may be electrically connected to a voltage line transmitting a driving voltage in the peripheral area PA. Accordingly, as described above, since it is possible to prevent voltage of other adjacent conductors from being affected as potentials of the pattern portion 181 and the pattern portion 183 are changed by coupling with another conductor adjacent thereto, it is possible to prevent display characteristics of the display device from deteriorating.

The insulating layer 145 may be disposed on the fourth conductive layer. The insulating layers 144 and 145 may define an opening 89 provided on the connecting member 179.

As described above, the pixel electrode 191, the light emitting layer 370, and the common electrode 270 may be sequentially disposed on the insulating layer 145. The pixel electrode 191, the light emitting layer 370, and the common electrode 270 may together form the light emitting diode ED.

The pixel electrode 191 may be electrically connected to the connecting member 179 through the opening 89 to receive a voltage.

In a plan view, the plurality of pixel electrodes 191 may be arranged in, for example, a pentile matrix structure as shown in FIG. 2 and FIG. 3 described above.

Hereinafter, a display device according to another embodiment of the present invention will be described with reference to FIG. 13 to FIG. 15 together with the drawings described above.

Figure 13:
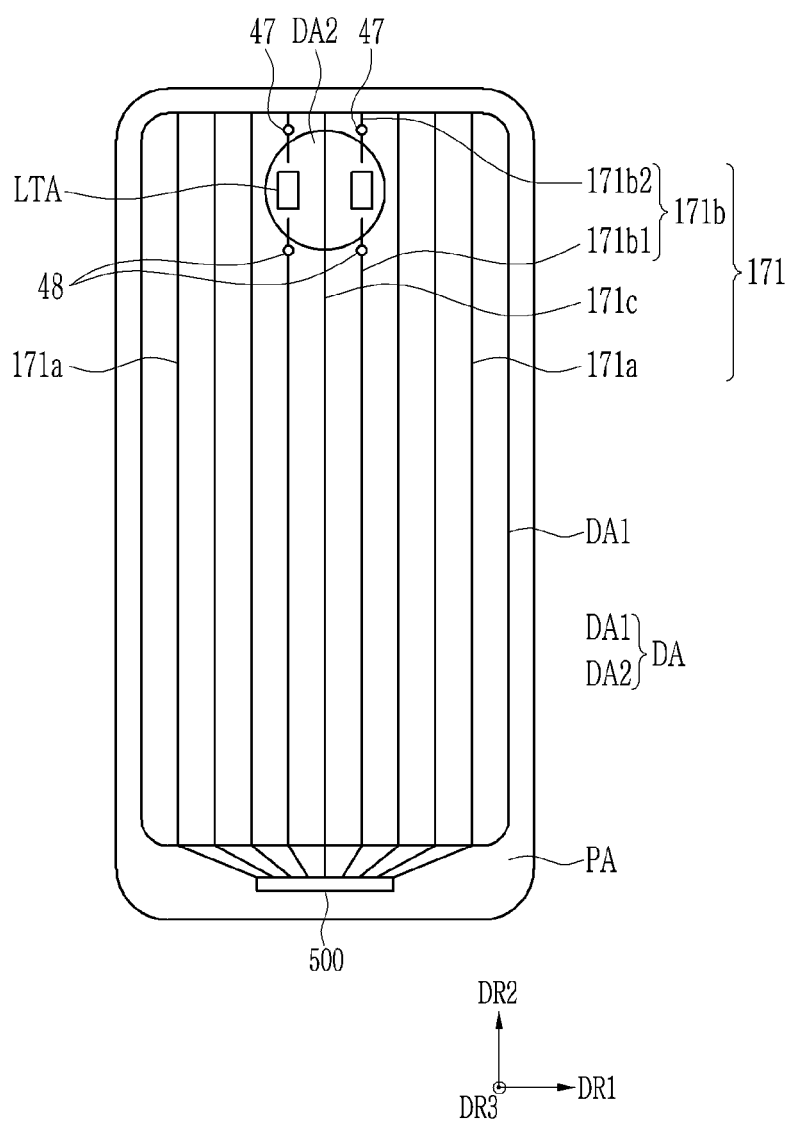
FIG. 13, FIGS. 14, and 15 respectively illustrate a plan view of a display device according to another embodiment of the present invention.
Figure 14:
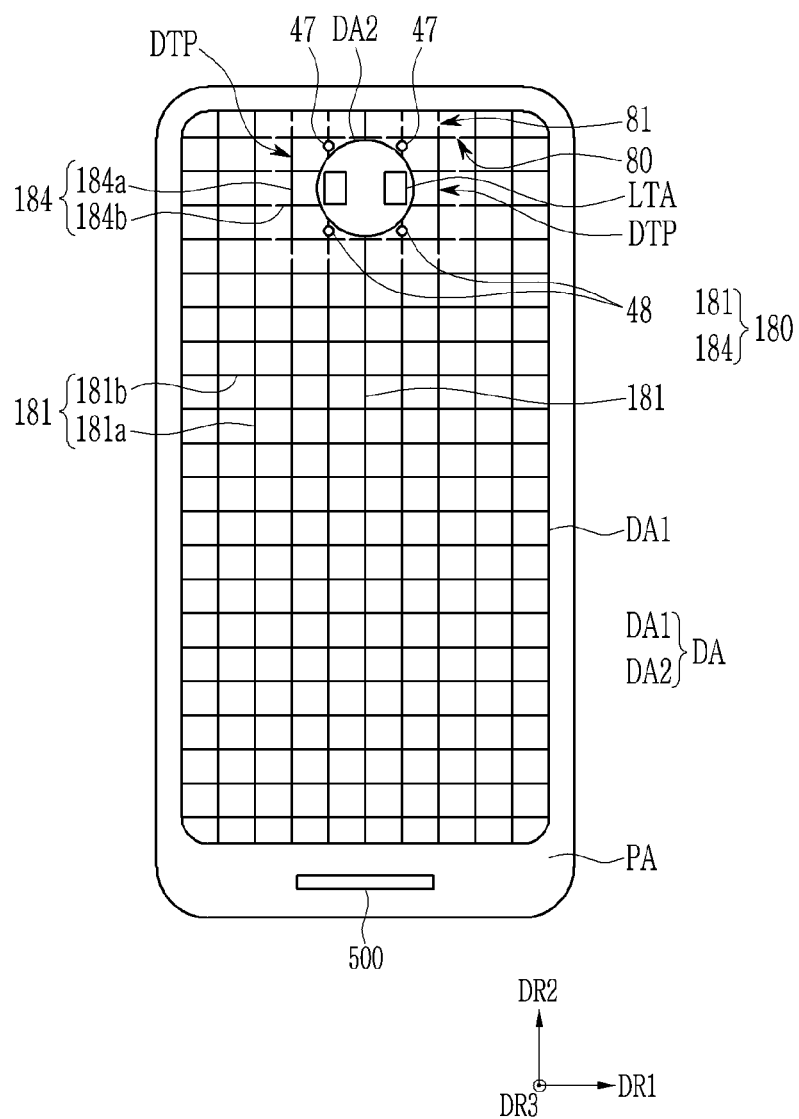
Figure 15:
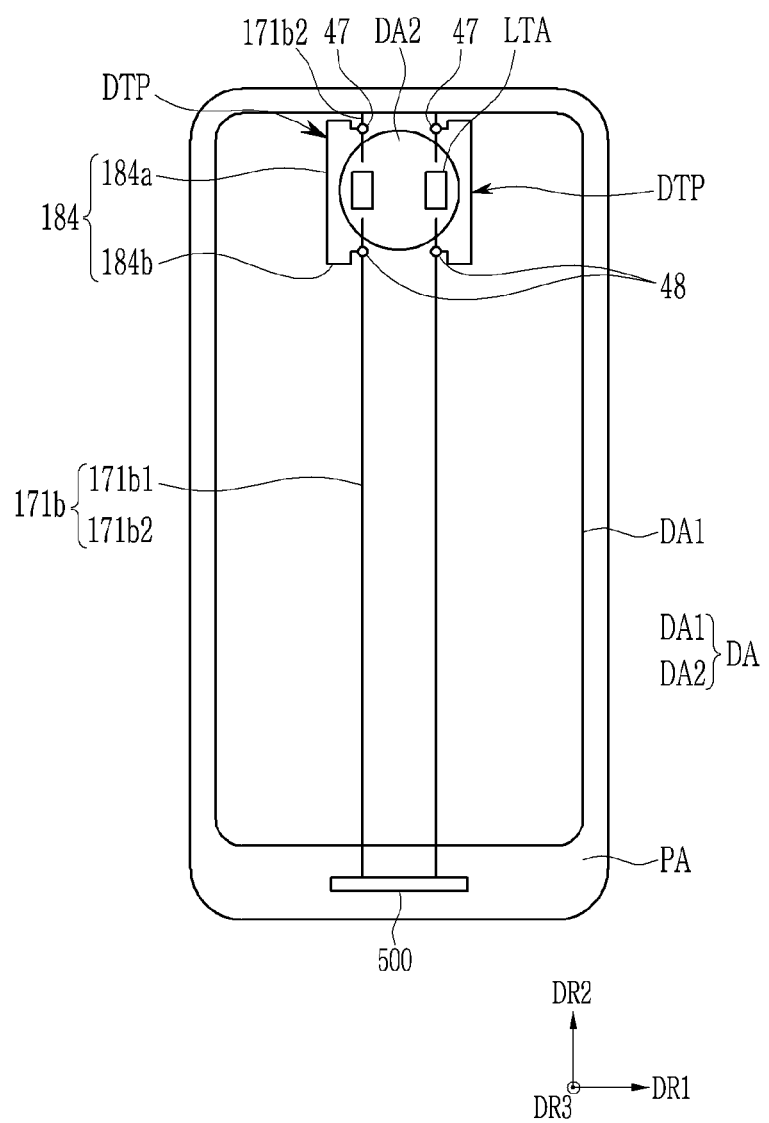

FIG. 13, FIGS. 14, and 15 respectively illustrate a plan view of a display device according to an embodiment of the present invention.

The display device according to the present embodiment is mostly the same as the display device according to the above-described embodiment, for example, the embodiments illustrated in FIG. 5 and FIG. 6. Therefore, differences from the above-described embodiment will be mainly described.

Unlike the previous embodiment, the first portion 171b1 of the second data line 171b may not be electrically connected to the second portion 171b2 of the second data line 171b in the lower peripheral area PA in a plan view. Instead, the first portion 171b1 of the second data line 171b of this embodiment may be electrically connected to the conductive pattern 180 through an opening 48 in the first display area DA1 around the lower side of the second display area DA2.

The second portion 171b2 of the second data line 171b may be electrically connected to the conductive pattern 180 through an opening 47 in the first display area DA1 around the upper side of the second display area DA2. Alternatively, the second portion 171b2 of the second data line 171b may be electrically connected to the conductive pattern 180 through an opening in the peripheral area PA.

Specifically, referring to FIG. 14, the conductive pattern 180 according to the present embodiment may include the pattern portion 181 and a pattern portion 184.

The pattern portion 181 may include the vertical portion 181a substantially extending in the second direction DR2 and the horizontal portion 181b substantially extending in the first direction DR1 as in the above-described embodiment. The vertical portion 181a and the horizontal portion 181b may be physically and electrically connected to each other, and may together receive a constant voltage.

The pattern portion 181 may be spaced apart from the second display area DA2. The pattern portion 181 may also be disposed at the lower side of the second display area DA2 in a plan view.

The pattern portion 184 may include a vertical portion 184a substantially extending in the second direction DR2 and a horizontal portion 184b substantially extending in the first direction DR1. The vertical portion 184a and the horizontal portion 184b may be physically and electrically connected to each other.

Unlike the pattern portion 182 of the embodiment described above, the pattern portion 184 may be disposed only around the second display area DA2, and may include the bypass portion DTP that is disposed between the pattern portion 181 and the second display area DA2 and bypasses the periphery of the second display area DA2.

The pattern portion 181 and the pattern portion 184 adjacent to each other are spaced apart from each other with the separation portions 80 and 81 therebetween, and are electrically insulated from each other.

In this embodiment, a length of the pattern portion 184 in the second direction DR2 may be shorter than a length of the display area DA in the second direction DR2.

The pattern portion 184 may be electrically connected to the first portion 171b1 of the second data line 171b through the opening 48 in the first display area DA1 around the lower side of the second display area DA2, and the pattern portion 184 may also extend to the upper peripheral area PA in a plan view to be electrically connected to the second portion 171b2 of the second data line 171b through the opening 47. One end of the pattern portion 184 may be electrically connected to the first portion 171b1 of the second data line 171b, and the other end of the pattern portion 184 may be electrically connected to the second portion 171b2 of the second data line 171b.

FIG. 15 illustrates the first portion 171b1 and the second portion 171b2 of the second data line 171b illustrated in FIG. 13 and a portion of the pattern portion 184 illustrated in FIG. 14. In the pattern portion 184, the horizontal portion 184b that extends only to the vertical portion 184a and has one end ending at the separation portion 80 is omitted in FIG. 15.

Referring to FIG. 15, the bypass portion DTP of the pattern portion 184 may include one vertical portion 184a adjacent to the second display area DA2, and a pair of horizontal portions 184b extending from upper and lower ends of the vertical portion 184a.

The first portion 171b1 of the second data line 171b may be electrically connected to the pattern portion 184 through the opening 48 in the first display area DA1 around the lower side of the second display area DA2. The second portion 171b2 of the second data line 171b may be electrically connected to the pattern portion 184 through the opening 47 in the first display area DA1 around the upper side of the second display area DA2.

The first portion 171*b*1 of the second data line 171*b* may receive a data signal from the driving circuit part 500, and may transmit the data signal to the pixel of the first display area DA1 disposed at the lower side of the second display area DA2 in a plan view and to the pixel disposed at the lower side of the light-transmitting portion LTA in a plan view among the pixels disposed in the second display area DA2.

In FIG. 15, the second portion 171*b*2 of the second data line 171*b* is disposed in the first display area DA1 disposed at the upper side of the second display area DA2 in a plan view, but since the second portion 171*b*2 is spaced apart from the first portion 171*b*1 with the light-transmitting portion LTA therebetween, the second portion 171*b*2 cannot directly receive the data signal from the first portion 171*b*1.

The pattern portion 184 according to the present embodiment may be electrically connected to the first portion 171*b*1 of the second data line 171*b* through the opening 48 in the first display area DA1 around the lower side of the second display area DA2 to transmit a data signal, The pattern portion 184 may be electrically connected to the second portion 171*b*2 of the second data line 171*b* through the opening 47 in the first display area DA1 around the upper side of the second display area DA2 via the bypass portion DTP of the pattern portion 184. Accordingly, the second portion 171*b*2 of the second data line 171*b* may receive a data signal from the first portion 171*b*1 of the second data line 171*b* or the driving circuit part 500 through the pattern portion 184. Accordingly, the data signal may be transmitted to the pixel circuit parts of the first display area DA1 and the second display area DA2 connected to the second portion 171*b*2 of the second data line 171*b*.

According to an embodiment, since it is not necessary to densely dispose the data lines and then bypass the second display area DA2, a sufficient area of the light-transmitting portion LTA may be secured, and influence due to coupling between the data lines may be reduced.

Referring to FIG. 14, since the pattern portion 181 similar to the pattern portion 184 is provided in the first display area DA1, it is possible to prevent only the pattern portion 184 from being partially viewed.

The pattern portion 181 may be applied with a constant voltage not to be floating. Accordingly, since it is possible to prevent a voltage of another adjacent conductor from being affected as a potential of the pattern portion 181 is changed by coupling with still another conductor adjacent to the pattern portion 181, it is possible to prevent display characteristics of the display device from deteriorating.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

<Description of symbols>

| | |
|---|---|
| 45, 46, 47, 48, 61, 62, 63, 64, 65, 66, 67, 68, 69: opening | |
| 80, 81: separation portion | 110: substrate |
| 111: buffer layer | 130: active layer |
| 131: active pattern | |
| 141, 142, 143, 144, 145, 350: insulating layer | |
| 150a, 150b, 170a, 170b: conductive layer | |
| 151, 152, 154: scan line | |
| 153: control Line | 156: storage line |
| 159: initializing voltage line | 171: data line |
| 172: driving voltage line | 180: conductive pattern |
| 181, 182, 183, 184: pattern portion 181a, 182a, 183a, 184a: vertical portion 181b, 182b, 183b, 184b: horizontal portion | |
| 191: pixel electrode | 270: common electrode |
| 370: light emitting layer | 500: driving circuit portion |
| 600: optical member | 1000: display panel |
| DA1, DA2, DA: display area | LTA: light transmitting layer |

What is claimed is:

1. A display device comprising:
a display area including a first area including a plurality of first pixels and a second area which is surrounded by the first area and overlaps at least one sensor;
a peripheral area disposed around the display area;
a data line including a first portion and a second portion spaced apart from each other in a predetermined direction with a gap therebetween; and
a conductive line including a bypass portion disposed in the first area and bypassing a periphery of the second area in a plan view, wherein
the bypass portion includes a portion disposed at a different conductive layer from the data line, and
the conductive line includes a first end that is electrically connected to the first portion of the data line and a second end that is electrically connected to the second portion of the data line.

2. The display device of claim 1, wherein
the peripheral area includes a first peripheral area and a second peripheral area opposing each other with the display area between the first peripheral area and the second peripheral area, and
the second portion of the data line extends to the second peripheral area and contacts the second end of the conductive line in the second peripheral area.

3. The display device of claim 2, wherein
the first portion of the data line extends to the first peripheral area and contacts the first end of the conductive line in the first peripheral area.

4. The display device of claim 1, wherein
the first portion of the data line contacts the first end of the conductive line in the display area,
the second portion of the data line contacts the second end of the conductive line in the display area, and
the first end and the second end oppose each other with the second area between the first end and the second end.

5. The display device of claim 1, wherein
the portion of the bypass portion disposed at the different conductive layer from the data line extends in a different direction of an extension direction of the data line.

6. The display device of claim 1, further comprising
a plurality of first voltage lines which transmits a first voltage,
wherein the conductive line includes a first vertical portion that overlaps the first voltage line in the plan view and extends along the first voltage line.

7. The display device of claim 6, further comprising:
a conductive pattern disposed in the first area and spaced apart from the conductive line.

8. The display device of claim 7, wherein
the conductive pattern includes a second vertical portion that overlaps the first voltage line in the plan view and extends along the first voltage line.
9. The display device of claim 8, wherein
the conductive line further includes a first horizontal portion that extends from the first vertical portion in a different direction from the first vertical portion, and
the conductive pattern further includes a second horizontal portion that extends from the second vertical portion in a different direction from the second vertical portion.
10. The display device of claim 9, further comprising
a plurality of second voltage lines which crosses the first voltage line and transmits a second voltage,
wherein the first horizontal portion and the second horizontal portion overlap the second voltage line in the plan view and extend along the second voltage line.
11. The display device of claim 7, wherein
the conductive pattern has a mesh shape.
12. The display device of claim 7, wherein
the conductive pattern receives a constant voltage.
13. The display device of claim 1, wherein
a length of the conductive line in the predetermined direction is shorter than a length of the display area in the predetermined direction.

* * * * *